United States Patent [19]

Haragashira

[11] Patent Number: 4,926,126
[45] Date of Patent: May 15, 1990

[54] PROBEHEAD OF MAGNETIC RESONANCE APPARATUS

[75] Inventor: Motoji Haragashira, Nishinasunomachi, Japan

[73] Assignee: Kabushiki Kaisha Toshiba, Kawasaki, Japan

[21] Appl. No.: 355,025

[22] Filed: May 22, 1989

[30] Foreign Application Priority Data

May 24, 1988 [JP] Japan .................. 63-124877

[51] Int. Cl.$^5$ .............................. G01R 33/20
[52] U.S. Cl. ........................ 324/322; 307/259
[58] Field of Search ............... 324/318, 322; 335/258, 335/262, 103; 307/241, 242, 259, 317.1; 375/68, 71

[56] References Cited

U.S. PATENT DOCUMENTS 4,763,076  8/1988  Arakawa et al. ............... 324/322
4,820,987  4/1989  Mens ............................. 324/322
4,855,680  8/1989  Arakawa et al. ............... 324/322

*Primary Examiner*—Hezron E. Williams
*Assistant Examiner*—Kevin D. O'Shea
*Attorney, Agent, or Firm*—Foley & Lardner, Schwartz, Jeffery, Schwaab, Mack, Blumenthal & Evans

[57] ABSTRACT

A probehead of an MR apparatus according to this invention includes transmitting and receiving coil elements for transmitting an RF field and receiving an MR signal based on an MR phenomenon induced in an object to be examined, respectively, and switching units for controlling decoupling of the transmitting and receiving coil elements. At least the switching unit provided for the transmitting coil element includes a plurality of PIN diodes connected in parallel with each other, and reactance elements connected in series with the plurality of PIN diodes and having reactance components, absolute values of which are sufficiently larger than resistance components of the PIN diodes in an on-state.

7 Claims, 5 Drawing Sheets

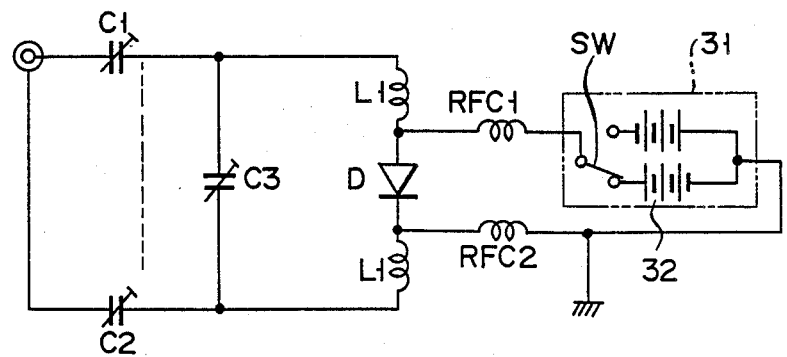
F I G. 2
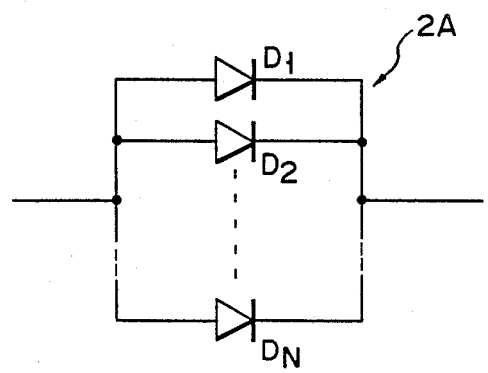
F I G. 3

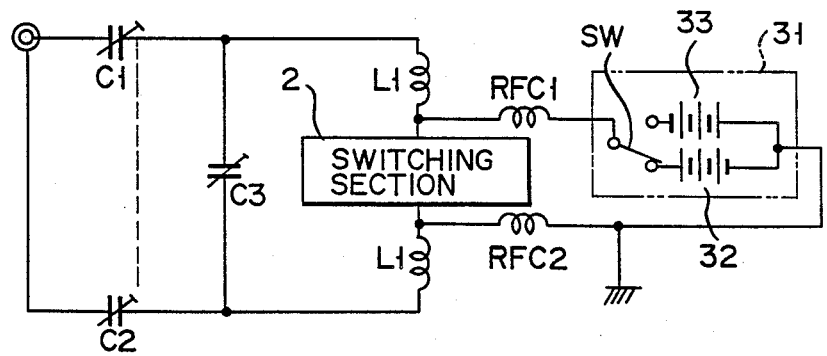
F I G. 4
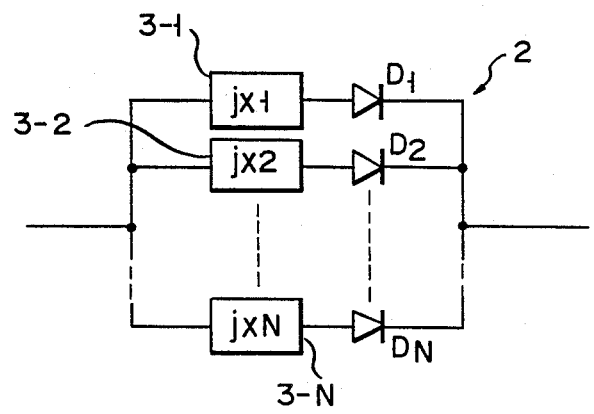
F I G. 5

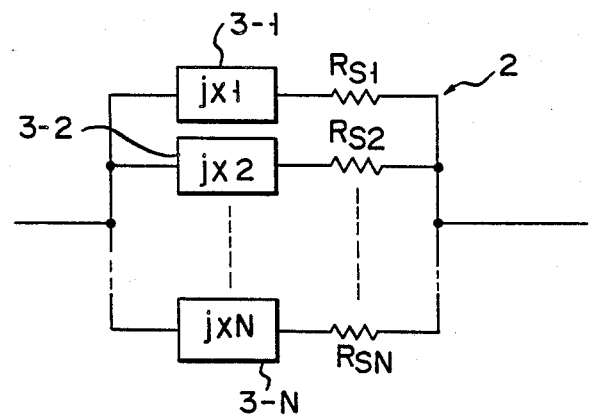
F I G. 6
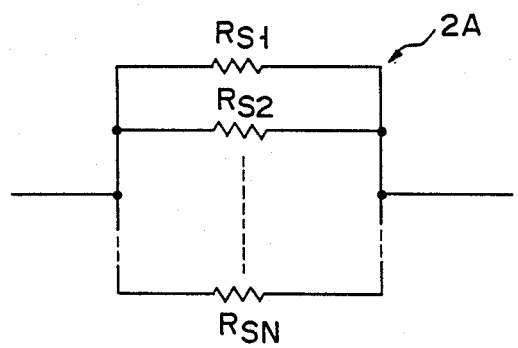
F I G. 7

PROBEHEAD OF MAGNETIC RESONANCE APPARATUS

BACKGROUND OF THE INVENTION

1. Field of the Invention

The present invention relates to a probehead of a magnetic resonance (MR) apparatus used to transmit an RF field and to receive an MR signal in an MR apparatus such as an MR imaging apparatus and an MR spectroscopy apparatus.

2. Description of the Related Art

A conventional probehead of an MR apparatus used in a medical diagnosis is arranged to have an equivalent circuit diagram shown in FIG. 1. This probehead comprises a transmitting coil L1, a receiving coil L2, and variable capacitors C1 to C6. In order to protect a function of the probehead and to maintain its signal-to-noise (S/N) ratio, one of the transmitting and receiving coils L1 and L2 which is currently not used must be decoupled. That is, upon transmission, the transmitting coil L1 for forming an RF field from the probehead toward an object to be examined is tuned, while the receiving coil L2 for receiving an MR signal based on an MR phenomenon of the object to be examined is decoupled. Upon reception, to the contrary to the transmission, the transmitting coil L1 is decoupled, and the receiving coil L2 is tuned. Such decoupling control upon transmission and reception is performed by a switching section 2A connected to each of the transmitting and receiving coils L1 and L2.

A PIN diode is used as a switching element for performing a decoupling operation of the coils L1 and L2 at high speed.

The following description will be limited to a transmitting coil for handling high RF power.

FIG. 2 shows a circuit of a transmitting system of a probehead using a PIN diode D.

The transmitting circuit shown in FIG. 2 comprises RF (choke) coils RFC1 and RFC2 and a diode driver 31 in addition to the variable capacitors C1, C2, and C3, the transmitting coil L1 and the PIN diode D. The driver 31 includes DC bias power supplies 32 and 33 and a switch SW.

The PIN diode D is obtained by inserting an I region (intrinsic region: an intrinsic semiconductor region having a sufficiently low impurity concentration) between a p- and n-type regions of a p-n junction diode. In the PIN diode D, an RF series resistance changes upon application of a forward DC bias current. In general, a single PIN diode D is used in a conventional probehead as shown in FIG. 2.

In a probehead for transmitting an intense RF field, however, it is difficult to control decoupling of the transmitting coil L1 by the single PIN diode D. The reasons for this are: (1) an RF power to be applied to the transmitting coil L1 is significantly high (high RF current is supplied to the coil L1); (2) the PIN diode D is preferably connected in series with the transmitting coil L1 in order to decouple the coil L1 within a wide range including the resonant frequency; and (3) since the transmitting coil L1 is a kind of a resonant circuit and therefore a large resonant current flows through each circuit element, it is very difficult to form an arrangement in which only the single PIN diode D can flow the RF current in a resonant mode. Therefore, the present inventor assumed that in a probehead for transmitting an intense RF magnetic field, a plurality of PIN diodes D1, D2, ..., DN must be connected in parallel with each other to arrange the switching section 2A as shown in FIG. 3.

When the PIN diodes D1, D2, ..., DN are simply connected in parallel with each other as shown in FIG. 3, however, an RF current Io concentrically flows to a specific PIN diode (e.g., D1) having a small ON resistance due to variations in ON resistances of the diodes D1, D2, ..., DN, thereby destroying this PIN diode.

On the contrary, when current-limiting resistors are connected in series with the PIN diodes D1, D2, ..., DN in order to prevent destruction of the PIN diode, destruction of the PIN diode can be prevented. However, the current-limiting resistors for balancing produces thermal noise. For this reason, such a current-limiting resistor cannot be used to prevent destruction of the PIN diode.

SUMMARY OF THE INVENTION

It is, therefore, an object of the present invention to provide a probehead of an MR apparatus in which an arrangement of a switching section of the probehead is improved to effectively control decoupling of the coil to which a high RF current is supplied without degrading a function of the probehead.

A probehead of an MR apparatus according to the present invention comprises transmitting and receiving coil elements for transmitting an RF magnetic field and receiving an MR signal based on an MR phenomenon induced in an object to be examined, respectively, and switching units for controlling decoupling of the transmitting and receiving coil elements, wherein at least the switching unit provided for the transmitting coil unit comprises a plurality of PIN diodes connected in parallel with each other, and reactance elements connected in series with the plurality of PIN diodes and having reactance components, absolute values of which are sufficiently larger than resistance components of the PIN diodes in an on-state.

According to the probehead of the present invention, an absolute value of a reactance component of each of the reactance elements connected in series with the plurality of parallel PIN diodes is sufficiently larger than a resistance component of each PIN diode. Therefore, an RF current to be flowed to the switching section is divided mainly in accordance with a ratio of each reactance component and flowed to each PIN diode. As a result, an influence of variations in resistance components of the respective PIN diodes can be effectively reduced, thereby preventing destruction of the PIN diode.

Therefore, since a plurality of PIN diodes can be connected in parallel with each other without being adversely affected by variations in the resistance components of the PIN diodes, a probehead of an MR apparatus capable of handling a high RF current and achieving a stable transmission/reception switching operation can be provided.

BRIEF DESCRIPTION OF THE DRAWINGS

FIG. 2 is a circuit diagram showing a part of the conventional probehead in detail;

FIG. 3 is a circuit diagram showing a parallel circuit of PIN diodes;

FIG. 4 is an equivalent circuit diagram showing an embodiment of a probehead according to the present invention;

FIG. 5 is a circuit diagram showing a switching section in the probehead shown in FIG. 4 in detail;

FIG. 6 is an equivalent circuit diagram of the switching section of the present invention shown in FIG. 5;

FIG. 7 is an equivalent circuit diagram of a switching section shown in FIG. 3;

DETAILED DESCRIPTION OF THE PREFERRED EMBODIMENTS

Figure 1:
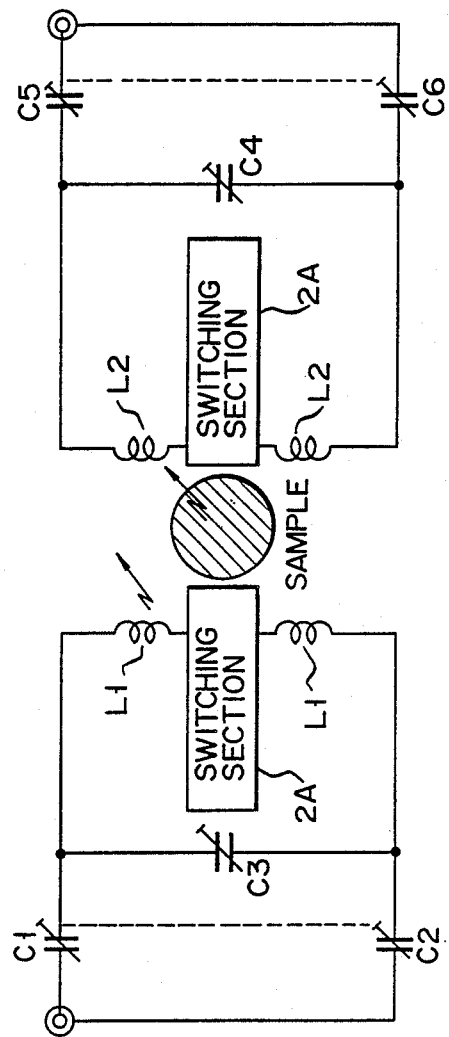
FIG. 1 is a basic equivalent circuit conventional probehead of an MR apparatus.

FIG. 4 equivalently shows a probehead of an MR apparatus according to an embodiment of the present invention. In the probehead shown in FIG. 4, the same reference numerals as in FIG. 2 denote parts having the same functions, and a detailed description thereof will be omitted.

The probehead shown in FIG. 4 differs from the probehead shown in FIG. 2 in that a switching section 2 is arranged as shown in FIG. 5.

That is, in the switching section 2, reactance elements 3-1, 3-2, ..., 3-N are connected in series with parallel PIN diodes D1, D2, ..., DN, respectively. In addition, as shown in FIG. 6, the reactance elements 3-1, 3-2, ..., 3-N are arranged to satisfy the following condition assuming that resistance components of the PIN diodes D1, D2, ..., DN are RS1, RS2, ..., RSN and reactance components of the reactance elements 3-1, 3-2, ..., 3-N are jX1, jX2, ..., jXN, respectively:

$$|jX1| = |jX2| = \ldots = |jXN| \quad (1)$$
$$= |jX| >> R1, R2, \ldots, RN$$

The above condition (1) is satisfied when the PIN diodes are in an on-state.

As the reactance elements 3-1, 3-2, ..., 3-N, coils (or conductors or conductor patterns equivalently serving as coils at the resonance frequency) or capacitors having small variations can be used.

A difference between internal power dissipation of the switching section 2 according to the embodiment of the present invention and the conventional switching section 2A comprising the parallel PIN diodes D1, D2, ..., DN not including reactance elements will be described below with reference to FIGS. 6 and 7.

Assume that a total current flowing through the switching section 2 or 2A is Io.

Internal power dissipation PD1, ..., PDN of the PIN diodes D1, ..., DN, respectively, of the conventional switching section 2A are as follows.

$$PD1 = \left( \frac{Io}{\sum_{j=1}^{N} \frac{1}{Rsj}} \right)^2 \cdot \frac{1}{RS1}$$

$$PDN = \left( \frac{Io}{\sum_{j=1}^{N} \frac{1}{Rsj}} \right)^2 \cdot \frac{1}{RSN}$$

Destruction occurs when a maximum one of these internal power dissipation exceeds allowable amount of the PIN diodes D1, ..., Dn. Therefore, assuming that maximum and minimum resistances of the resistance components RS1, ..., RSN are RSmax and RSmin, respectively, a maximum internal power dissipation PDmax is represented by the following equation:

$$PDmax = \left( \frac{Io}{\sum_{j=1}^{N} \frac{1}{Rsj}} \right)^2 \cdot \frac{1}{RSmin} \quad (2)$$

and the following relation is established:

$$\left( \frac{Io}{\frac{N}{RSmin}} \right)^2 \cdot \frac{1}{RSmin} < PDmax < \left( \frac{Io}{\frac{N}{RSmax}} \right)^2 \cdot \frac{1}{RSmin}$$

PDmax falls within the range determined by the following equation. That is, when no current-limiting reactance element is present:

$$\left( \frac{Io}{N} \right)^2 \cdot RSmin < PDmax < \left( \frac{Io}{N} \right)^2 \cdot \frac{RSmax^2}{RSmin} \quad (3)$$

In the case of the switching section 2 shown in FIG. 6, assuming that internal power dissipation of the PIN diodes D1, ..., DN are PD1', ..., PDN', respectively, the following equation is established:

$$PD1' = \left| \frac{\frac{1}{jX1 + RS1} \cdot Io}{\sum_{k=1}^{N} \frac{1}{jKX + RSK}} \right|^2 \cdot RS1$$

From equation (1) and $|jXK| >> RSK$, the following equations are obtained:

$$PD1' \approx \left| \frac{\frac{1}{jX1} \cdot Io}{\sum_{k=1}^{N} \frac{1}{jXK}} \right|^2 \cdot RS1 = \left( \frac{Io}{N} \right)^2 \cdot RS1$$

Likewise:

$$PD2' \approx \left( \frac{Io}{N} \right)^2 \cdot RS2$$

·
·
·

$$PDN' \approx \left( \frac{Io}{N} \right)^2 \cdot RSN$$

At this time, a maximum internal loss PDmax' is represented by the following equation:

$$PDmax' = \left( \frac{Io}{N} \right)^2 \cdot RSmax \quad (4)$$

Therefore, from equations (3) and (4), since (RSmax/RSmin) >1 is established due to variations in resistance components RS1, ..., RSN of the PIN diodes D1, ..., DN, the upper limits of the maximum internal losses satisfy PDmax>PDmax'.

That is, the maximum internal loss PDmax' of the switching section 2 shown in FIG. 6 according to the present invention is smaller than the maximum internal power dissipation PDmax of the switching section 2A shown in FIG. 7 not including the reactance elements 3-1, ..., 3-N.

In other words, since the allowable internal power dissipation of the PIN diodes D1, ..., DN is constant, upper limit variations in the PIN diodes D1, ..., DN of an RF current to be flowed through the probehead are smaller in the switching section 2 than in the switching section 2A.

As a result, the switching section 2 according to the embodiment of the present invention can suppress variations in an allowable RF current due to variations in resistance components RS1, ..., RSN of the PIN diodes D1, ..., DN. Therefore, the parallel PIN diodes D1, ..., DN can be stably used.

Figure 8:
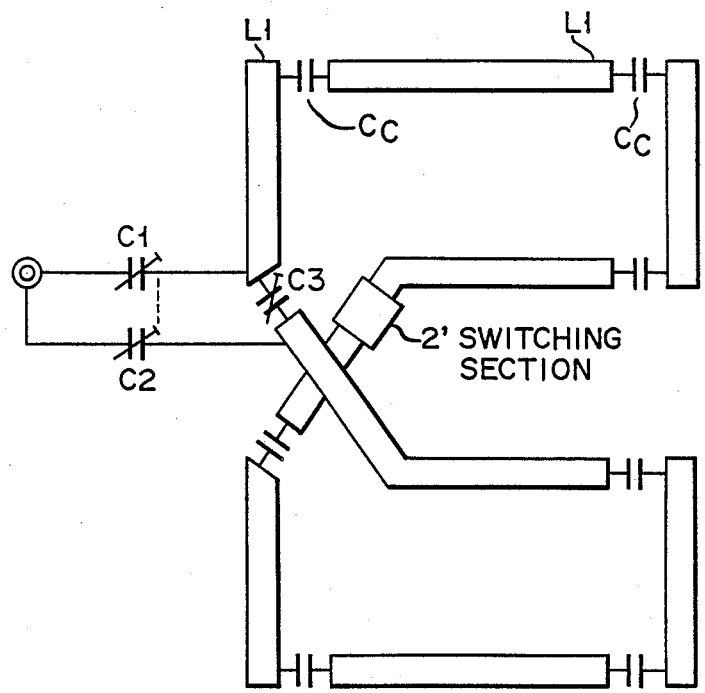
FIG. 8 is a schematic view showing a part of another embodiment of the probehead according to the present invention.
Figure 9:
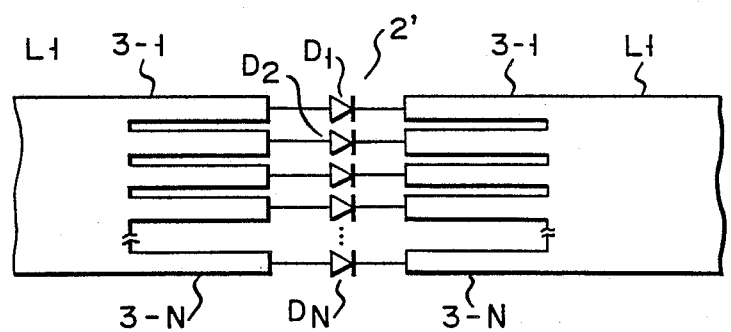
FIG. 9 is a view showing an arrangement of a switching section in the embodiment shown in FIG. 8 in detail.

For example, in MR apparatuses using a saddle coil for transmission, the transmitting coil L1 of the probehead comprises band-like conductor plates as schematically shown in an expanded view of FIG. 8. In FIG. 8, the same reference numerals as in FIG. 4 denote the same parts. The transmitting coil L1 comprises, e.g., band-like copper plates. Fixed capacitors Cc comprising, e.g., ceramic capacitors are placed at regular intervals of the transmitting coil L1 in order to decrease an apparent inductance. In this case, as shown in FIG. 9, a switching section 2' for decoupling may have an arrangement in which the band-like copper plates constituting the coil L1 are partially notched to form a plurality of narrow band-like portions serving as reactances (in this case, inductances) and PIN diodes D1, D2, ..., DN are inserted therein.

The present invention is not limited to the above embodiment but can be variously modified without departing from the spirit and scope of the invention.

For example, although a transmitting coil has been described in the above embodiment, a receiving coil can be similarly arranged as described above. In addition, parallel PIN diodes are generally required for a transmitting coil for flowing a high RF current. Therefore, the PIN diodes need not be provided in parallel with each other in a receiving coil, i.e., the present invention need not be applied to a receiving coil.

What is claimed is:

1. A probehead of a magnetic resonance (MR) apparatus, comprising:
   transmitting coil means for transmitting an RF field;
   receiving coil means for receiving an MR signal based on an MR phenomenon induced in an object to be examined; and
   switching means, provided for each of said transmitting and receiving means, for decoupling,
   wherein at least said switching means provided for said transmitting coil means comprises a plurality of PIN diodes connected in parallel with each other, and reactance elements connected in series with said plurality of PIN diodes and having reactance components, absolute values of which are sufficiently larger than resistance components of said PIN diodes in an on-state.

2. A probehead according to claim 1, wherein said reactance elements comprise coils.

3. A probehead according to claim 1, wherein reactance elements comprise conductor serving as inductances.

4. A probehead according to claim 1, wherein said reactance elements comprise capacitors.

5. A probehead according to claim 1, wherein said transmitting coil means comprise band-like conductors, and said reactance elements comprise narrow band-like portions formed by partially dividing said band-like conductors into a plurality of portions.

6. A probehead according to claim 1, wherein said switching means provided for said receiving coil means also comprises a plurality of PIN diodes connected in parallel with each other, and reactance elements connected in series with said plurality of PIN diodes and having reactance components, absolute values of which are sufficiently larger than resistance components of said PIN diodes in an on-state.

7. A probehead according to claim 1, wherein said switching means provided for said receiving coil means comprises a single PIN diode.

* * * * *